(12) United States Patent
Fujii

(10) Patent No.: US 9,519,030 B2
(45) Date of Patent: Dec. 13, 2016

(54) VOLTAGE DETECTION DEVICE

(71) Applicant: Yazaki Corporation, Minato-ku, Tokyo (JP)

(72) Inventor: Hironao Fujii, Susono (JP)

(73) Assignee: Yazaki Corporation, Minato-ku, Tokyo (JP)

( * ) Notice: Subject to any disclaimer, the term of this patent is extended or adjusted under 35 U.S.C. 154(b) by 96 days.

(21) Appl. No.: 14/435,353

(22) PCT Filed: Sep. 26, 2013

(86) PCT No.: PCT/JP2013/076144
§ 371 (c)(1),
(2) Date: Apr. 13, 2015

(87) PCT Pub. No.: WO2014/061422
PCT Pub. Date: Apr. 24, 2014

(65) Prior Publication Data
US 2015/0293178 A1 Oct. 15, 2015

(30) Foreign Application Priority Data
Oct. 18, 2012 (JP) .................................. 2012-230606

(51) Int. Cl.
*G01R 31/36* (2006.01)
*H02J 7/00* (2006.01)
(Continued)

(52) U.S. Cl.
CPC ......... *G01R 31/3658* (2013.01); *G01R 31/362* (2013.01); *H01M 10/482* (2013.01);
(Continued)

(58) Field of Classification Search
CPC .............. G01R 31/362; G01R 31/3658; H01M 10/482; H01M 2010/4271; H02J 7/0021; Y02T 10/7055
(Continued)

(56) References Cited

U.S. PATENT DOCUMENTS 8,421,413 B2   4/2013   Mizoguchi et al.
8,552,729 B2   10/2013  Sekizaki et al.
(Continued)

FOREIGN PATENT DOCUMENTS

JP   2003-017134 A   1/2003
JP   2010-081692 A   4/2010
(Continued)

OTHER PUBLICATIONS

Oct. 29, 2013—(WO) Written Opinion of the ISA—App PCT/JP2013/076144 Eng Tran.
(Continued)

*Primary Examiner* — Nathaniel Pelton
(74) *Attorney, Agent, or Firm* — Banner & Witcoff, Ltd.

(57) ABSTRACT

It is provided that pull-down resistors ($R_1$ to $R_{n-1}$) which are respectively connected in parallel to blocks ($CB_1$ to $CB_{n-1}$) except for a block ($CB_n$) that corresponds to a battery monitoring IC ($2n$) connected to a main microcomputer (3) via an insulation I/F (4) so as to be capable of communication, thereby equalizing current consumed in battery monitoring ICs (21 to 2n).

3 Claims, 3 Drawing Sheets

(51) Int. Cl.
*H01M 10/48* (2006.01)
*H01M 10/42* (2006.01)

(52) U.S. Cl.
CPC ... *H02J 7/0021* (2013.01); *H01M 2010/4271* (2013.01); *Y02T 10/7055* (2013.01)

(58) Field of Classification Search
USPC ........................................................ 324/434
See application file for complete search history.

(56) References Cited

U.S. PATENT DOCUMENTS

| | | | |
|---|---|---|---|
| 8,878,491 B2 | 11/2014 | Shimizu | |
| 2009/0091297 A1* | 4/2009 | Ishikawa | H01M 10/443 320/134 |
| 2011/0050236 A1 | 3/2011 | Sekizaki et al. | |
| 2011/0156714 A1 | 6/2011 | Mizoguchi et al. | |
| 2011/0210700 A1 | 9/2011 | Shimizu | |
| 2013/0057219 A1* | 3/2013 | Sakata | B60L 11/1866 320/118 |
| 2013/0234719 A1* | 9/2013 | Sekizaki | G01R 31/3658 324/433 |

FOREIGN PATENT DOCUMENTS

| | | |
|---|---|---|
| JP | 2011-050176 A | 3/2011 |
| JP | 2011-134577 A | 7/2011 |
| JP | 2011-182550 A | 9/2011 |
| WO | 2011135868 A1 | 11/2011 |

OTHER PUBLICATIONS

Oct. 29, 2013—International Search Report—Intl App PCT/JP2013/076144.
Aug. 31, 2016—(JP) Notification of Reasons for Refusal—App 2012-230606, Eng Tran.

* cited by examiner

VOLTAGE DETECTION DEVICE

TECHNICAL FIELD

The present invention relates to voltage detection devices and, in particular, relates to a voltage detection device for detecting a voltage across each of a plurality of unit cells connected in series.

BACKGROUND ART

For example, an assembled battery mounted on a hybrid car or an electric car is configured by a plurality of unit cells connected in series. The assembled battery generates a high voltage such as 200 V at the both ends thereof and supplies electric power thus generated to a driving motor. In such the assembled battery, it is necessary to detect and monitor the voltage across each of the unit cells so as to prevent an over discharge state and an overcharge state.

As the aforesaid voltage detection device for detecting a voltage across each of the unit cells, the device shown in FIG. 4 has been proposed (see patent literatures 1 and 2). As shown in this figure, a voltage detection device 100 detects a voltage across each of a plurality of unit cells $C_{11}$ to $C_{mn}$ (m and n are arbitrary integers) that are connected in series and constitute an assembled battery BH. That is, the assembled battery BH includes n blocks $CB_1$ to $CB_n$.

The voltage detection device 100 includes a plurality of battery monitoring ICs 201 to 20n for detecting voltage across each of the unit cells $C_{11}$ to $C_{mn}$ and a main microcomputer 300 which outputs detection instructions to the battery monitoring ICs 201 to 20n and receives detection voltage from the battery monitoring ICs 201 to 20n. The battery monitoring ICs 201 to 20n are respectively provided in correspondence to the blocks $CB_1$ to $CB_n$ that are obtained by dividing the unit cells $C_{11}$ to $C_{mn}$ into plural blocks, in order to reduce a withstanding voltage. Each of the battery monitoring ICs is fed from the corresponding one of the blocks $CB_1$ to $CB_n$ and then operated. The main microcomputer 300 is fed from a low-voltage battery different from the assembled battery BH and then operated.

It is necessary to perform a communication, in an electrically insulated state, between the main microcomputer 300 fed from the aforesaid low-voltage battery and the battery monitoring ICs 201 to 20n fed from the high-voltage assembled battery BH. That is, the communication is required to be performed using an insulation interface (I/F). As the insulation interface schema, a daisy chain schema having a high scalability is used. According to the daisy chain schema, the communication can be performed using the single insulation interface (I/F) 400. Further, the daisy chain schema can easily cope with increase and decrease etc. of the battery monitoring ICs 201 to 20n.

As shown in FIG. 4, according to the daisy chain schema, the battery monitoring ICs 201 to 20n are connected in cascade, and only the battery monitoring IC 20n of the highest voltage as one of the battery monitoring ICs 201 to 20n is connected to the main microcomputer 300 via the insulation I/F 400 so as to be capable of communication. According to the aforesaid configuration, the battery monitoring IC 20n directly communicates with the main microcomputer 300 via the insulation I/F 400. Each of the battery monitoring ICs 201 to 20(n-1) communicates with the main microcomputer 300 via the insulation I/F 400 and the corresponding one or ones of the battery monitoring ICs 201 to 20n on the high-voltage side than the each battery monitoring IC.

CITATION LIST

Patent Literature

Patent Literature 1: JP-A-2011-134577
Patent Literature 2: JP-A-2011-50176

SUMMARY OF INVENTION

Technical Problem

However, according to the aforesaid daisy chain schema, there are the battery monitoring IC 20n which communicates with the main microcomputer 300 and the battery monitoring ICs 201 to 20(n-1) each of which communicates only between the battery monitoring ICs and does not directly communicate with the main microcomputer 300. The battery monitoring IC 20n directly communicating with the main microcomputer 300 is required to feed to the insulation I/F 400 for performing communication with the main microcomputer 300. Thus, an amount of consumption current of this battery monitoring IC becomes larger. In contrast, since the battery monitoring IC 201 communicates only with the high-voltage side battery monitoring IC 202 and does not communicate with the low-voltage side battery monitoring IC, an amount of consumption current thereof becomes smaller by an amount corresponding to the communication with the low-voltage side battery monitoring IC. Further, the consumption current varies among the battery monitoring ICs 201 to 20n due to individual differences of the battery monitoring ICs 201 to 20n. When the consumption current varies among the battery monitoring ICs 201 to 20n in this manner, the consumption current also varies among the blocks $CB_1$ to $CB_n$ respectively feeding to the battery monitoring ICs 201 to 20n.

When the voltage across the unit cell varies among the unit cells $C_{11}$ to $C_{mn}$ due to the variation of the consumption current among the battery monitoring ICs 201 to 20n, a usable range of the battery capacity used for usual charging and discharging is narrowed. Thus, there arises a problem that the battery capacity can not be used effectively and hence becomes wasteful partially. Further, equalizing discharge is required in order to adjust the variation of the voltage across the unit cell among the unit cells $C_{11}$ to $C_{mn}$.

The invention is made in view of the aforesaid circumstances and an object of the invention is to provide a voltage detection device which equalizes consumption current of respective voltage detection units to thereby prevent variation of unit cells.

Solution of Problem

In order to solve the aforesaid problem, as a voltage detection device according to the first mode of the invention, there is provided a voltage detection device which includes:

a plurality of voltage detection units which are respectively provided in correspondence to a plurality of blocks which are obtained by dividing a plurality of unit cells connected in series, each of the plurality of voltage detection units being fed from corresponding one of the plurality of blocks and operated to detect a voltage across each of the unit cells constituting the corresponding one of the plurality of blocks;

a control unit which receives detection results from the plurality of voltage detection units; and an insulation interface which connects between one of the plurality of voltage detection units and the control unit so as to be capable of communication therebetween; and current consumption elements which are respectively connected in parallel to the plurality of blocks except for the block which corresponds to the voltage detection unit connected to the control unit via the insulation interface so as to be capable of communication, thereby equalizing current consumed in the plurality of voltage detection units, wherein the plurality of voltage detection units are connected in cascade so as to be capable of communication mutually.

As the voltage detection device according to the second mode of the invention, there is provided with the voltage detection device according to the first mode, wherein one of the plurality of voltage detection units located on one end side of the plurality of voltage detection units connected in cascade is connected to the control unit via the insulation interface so as to be capable of communication.

As the voltage detection device according to the third mode of the invention, there is provided with the voltage detection device according to the second mode, wherein one of the current consumption elements, connected in parallel to the block which corresponds to one of the plurality of voltage detection units located on the other end side of the plurality of voltage detection units connected in cascade, flows current larger than current flowing through the others of the current consumption elements.

According to the first mode, since the consumption current of the respective voltage detection units is equalized by providing the current consumption elements, the variation of the unit cells can be prevented.

According to the second mode, among the voltage detection units connected in cascade, the voltage detection unit on the one end side is connected to the control unit via the insulation interface so as to be capable of communication therebetween. Thus, the configuration of all the voltage detection units can be made same.

According to the third mode, among the voltage detection units connected in cascade, the current consumption element provided at the voltage detection unit on the other end side is configured to flow a larger current than the other current consumption elements. Thus, the consumption current of the respective voltage detection units can be equalized more surely.

Advantageous Effects of Invention

According to the invention, a voltage detection device can be provided which equalizes the consumption current of respective voltage detection units to thereby prevent variation of unit cells.

DESCRIPTION OF EMBODIMENTS

Figure 1:
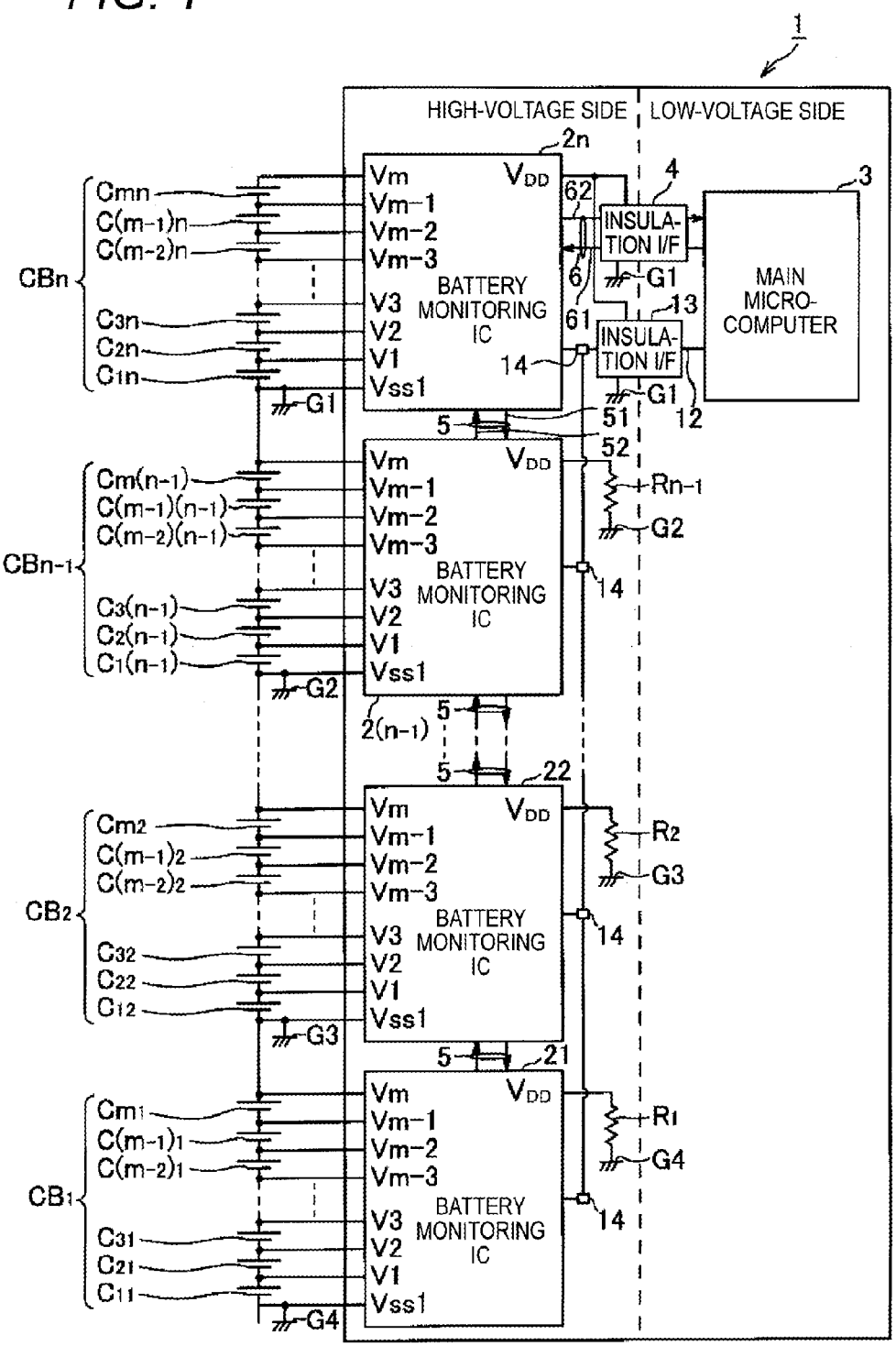
FIG. 1 A block diagram showing an embodiment of the voltage detection device according to the invention.

Hereinafter, an embodiment of the voltage detection device according to the invention will be explained with reference to FIGS. 1 to 4. As shown in FIG. 1, the voltage detection device 1 is a device which detects a voltage across each of a plurality of unit cells $C_{11}$ to $C_{mn}$ connected in series that constitute an assembled battery BH. Although each of the unit cells $C_{11}$ to $C_{mn}$ (m and n are arbitrary integers) is configured by a single secondary battery in this embodiment, each of the unit cells may be configured by a plurality of secondary batteries.

The assembled battery BH is used, for example, as the power supply of an electric motor in a hybrid electric car which uses an engine and the electric motor (both not shown) together as a travelling driving source. To the both terminals of the assembled battery BH, the electric motor is connected as a load as the need arises, and further an alternator etc. (not shown) is connected as a charger as the need arises. The unit cells $C_{11}$ to $C_{mn}$ are divided into n blocks $CB_1$ to $CB_n$. In other words, the assembled battery BH includes the n blocks $CB_1$ to $CB_n$. Each of the blocks $CB_1$ to $CB_n$ is configured by m unit cells.

As shown in FIG. 1, the voltage detection device 1 includes battery monitoring ICs 21 to 2n as n voltage detection units for detecting voltage across each of the unit cells $C_{11}$ to $C_{mn}$ and a main microcomputer 3. The main microcomputer acts as a control unit which outputs voltage detection instructions to the battery monitoring ICs 21 to 2n and receives detection voltage from the battery monitoring ICs 21 to 2n. The battery monitoring ICs 21 to 2n are respectively provided in correspondence to the blocks $CB_1$ to $CB_n$. Each of the battery monitoring ICs is fed from the corresponding one of the blocks $CB_1$ to $CB_n$ and then operated. Each of the battery monitoring ICs 21 to 2n detects a voltage across each of corresponding ones of the unit cells $C_{11}$ to $C_{mn}$ constituting corresponding one of the blocks $CB_1$ to $CB_n$. The main microcomputer 3 is fed from a low-voltage battery (not shown) electrically insulated from the assembled battery BH and then operated.

The voltage detection device 1 is a device of a so-called daisy chain scheme and hence the battery monitoring ICs 21 to 2n are connected in cascade so as to be capable of communication mutually via communication lines 5. The communication lines 5 are connected between adjacent ones of the battery monitoring ICs 21 to 2n. The communication lines are configured by a transmission line 51 for transmitting data from each of the battery monitoring ICs 22 to 2n to the corresponding one of the battery monitoring ICs 21 to 2(n−1) adjacent thereto on the low-voltage side, and a reception line 52 for transmitting data from each of the battery monitoring ICs 21 to 2(n−1) to the corresponding one of the battery monitoring ICs 22 to 2n adjacent thereto on the high-voltage side. According to the aforesaid configuration, each of the battery monitoring ICs 21 to 2n is provided so as to be capable of bidirectional communication with the corresponding one or ones of the battery monitoring ICs 21 to 2n adjacent thereto.

Among the battery monitoring ICs 21 to 2n connected in cascade, only the battery monitoring IC 2n on the highest voltage side (one end side) is connected to the main microcomputer 3 via communication lines 6 so as to be capable of communication therebetween. An insulation I/F 4 is interposed in the communication lines 6, whereby communication between the battery monitoring IC 2n and the main microcomputer 3 can be performed in a state of electrically insulated therebetween. As the insulation I/F 4, for example, there are known a unit using light as transmission medium such as a photo coupler configured by a light emitting element and a light receiving element, and a unit using magnetic as transmission medium such as a magnetic coupler. The communication lines 6 are configured by a transmission line 61 for transmitting data to the battery monitoring IC 2n and a reception line 62 for receiving data from the battery monitoring IC 2n. The main microcomputer 3 is provided so as to be capable of bidirectional communication with the battery monitoring IC 2n.

Figure 2:
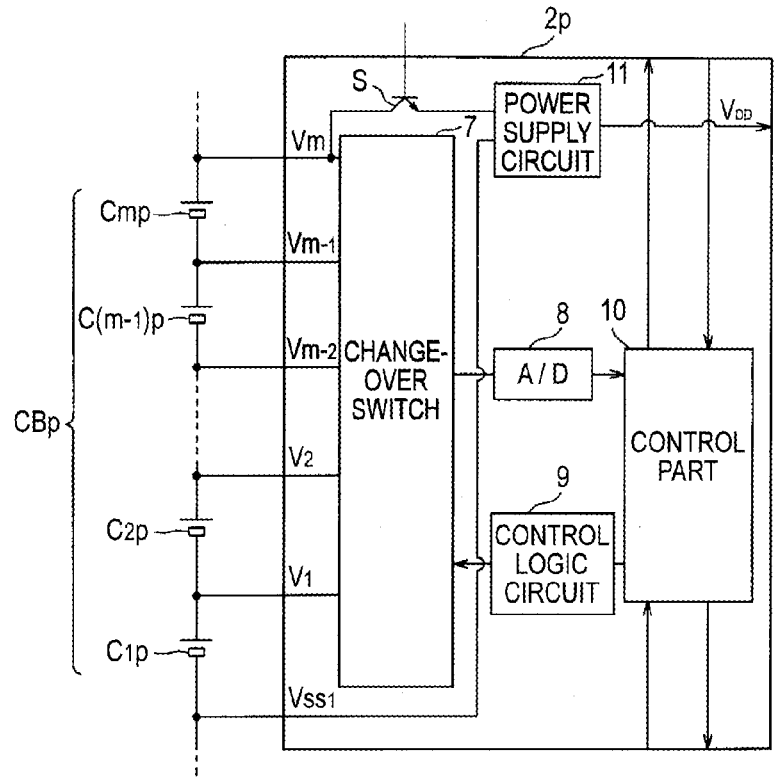
FIG. 2 A diagram showing the details of a battery monitoring IC constituting the voltage detection device shown in FIG. 1.

Next, the detailed configuration of the battery monitoring ICs 21 to 2n will be explained with reference to FIG. 2. Incidentally, since each of the battery monitoring ICs 21 to 2n has the substantially same configuration, the explanation will be made as to an arbitrary battery monitoring IC 2p (p is an arbitrary integer equal to or larger than 1 and equal to or smaller than n) as a representative. As shown in FIG. 2, the battery monitoring IC 2p includes terminals $V_1$ to $V_m$ respectively connected to the anode sides of the unit cells $C_{1p}$ to $C_{mp}$ constituting the corresponding block $CB_p$, and a terminal $V_{ss1}$ connected to the cathode side of the unit cell $C_{1p}$.

Further, the battery monitoring IC 2p includes a change-over switch 7 for connecting one of the terminals $V_1$ to $V_m$ to the input of an A/D converter 8 described later, a control logic circuit 9 for controlling the change-over switch 7, a control part 10 for controlling the A/D converter 8 and the control logic circuit 9, a power supply circuit 11 for generating power supply voltage to be supplied to the A/D converter 8, the control logic circuit 9 and the control part 10, an interruption switch S and a power supply terminal $V_{DD}$.

The power supply circuit 11 generates the power supply voltage of a predetermined value from the voltage across the corresponding block $CB_p$ and supplies the power supply voltage thus generated to the A/D converter 8, the control logic circuit 9 and the control part 10. The interruption switch S is provided between the anode side of the block $CB_p$ and the power supply circuit 11. The interruption switch S is a switch for turning on/off the supply of the voltage across the corresponding block $CB_p$ to the power supply circuit 11 to thereby turn on/off the power supply to the battery monitoring IC 2p. The power supply terminal $V_{DD}$ outputs the power supply voltage of the anode side generated by the power supply circuit 11.

Further, as shown in FIG. 1, the aforesaid voltage detection device 1 includes a power supply line 12, an insulation I/F 13 and n level shift circuits 14. According to this configuration, the interruption switches S can be simultaneously turned on/off according to a power supply signal outputted from the main microcomputer 3. The one end of the power supply line 12 is connected to the main microcomputer 3, whilst the other end thereof is brunched into plural lines and connected to the bases of transistors constituting the interruption switches S of the battery monitoring ICs 21 to 2n, respectively. The insulation I/F 13 is connected to the one end side of the power supply line 12 not being brunched to thereby couple between the interruption switches S and the main microcomputer 3 in an electrically insulated state therebetween. The n level shift circuits 14 are provided at the brunched portions of the power supply line 12, respectively. Each of the level shifter circuits converts the power supply signal transmitted from the main microcomputer 3 to a signal having a level suitable for turning on/off the corresponding interruption switch S.

The high voltage sides of the insulation I/Fs 4 and 13 are connected between the power supply terminal $V_{DD}$ of the battery monitoring IC 2n and the cathode side of the block $CB_n$, whereby the high voltage sides of the insulation I/Fs 4 and 13 are fed from the block $CB_n$ and then operated. The low voltage sides of the insulation I/Fs 4 and 13 are fed from a low-voltage battery (not shown) and then operated. Further, pull-down resistors $R_1$ to $R_{n-1}$ as current consumption elements are connected between the power supply terminals $V_{DD}$ of the battery monitoring ICs 21 to 2(n−1) except for the battery monitoring IC 2n and the cathode sides of the blocks $CB_1$ to $CB_{n-1}$ corresponding to the battery monitoring ICs 21 to 2(n−1), respectively. That is, the pull-down resistors $R_1$ to $R_{n-1}$ are connected in parallel to the blocks $CB_1$ to $CB_{n-1}$, respectively. Each of the pull-down resistors $R_1$ to $R_{n-1}$ acts to flow a current from the corresponding one of the blocks $CB_1$ to $CB_{n-1}$ corresponding to the battery monitoring ICs 21 to 2(n−1) to thereby equalize current consumed in the battery monitoring ICs 21 to 2n.

As explained in the Background Art, in the voltage detection device 1 of the daisy chain schema, the consumption current of the battery monitoring IC 2n connected to the main microcomputer 3 becomes maximum among all the battery monitoring ICs. In contrast, the consumption current of the battery monitoring IC 21 on the lowest voltage side (the other end side) becomes minimum among the battery monitoring ICs 21 to 2n connected in cascade. In the voltage detection device 1 according to the invention, the pull-down resistors $R_1$ to $R_{n-1}$ are added to thereby flow the consumption current through the pull-down resistors $R_1$ to $R_{n-1}$. Thus, with respect to the variation of the consumption current among the battery monitoring ICs 21 to 2n, the consumption current of each of the battery monitoring ICs 21 to 2(n−1) is increased so as to coincide with the consumption current of the battery monitoring IC 2n as the maximum consumption current. In this manner, the consumption current is adjusted so as to eliminate the variation thereof and be equalized among all the battery monitoring ICs.

Following factors are considered as the cause of the variation of the consumption current among the battery monitoring ICs 21 to 2n.

(1) Variation caused by the increased amount of the consumption current in the battery monitoring IC 2n, communicating with the main microcomputer 3, required for feeding to the insulation I/Fs 4 and 13 so as to communicate with the main microcomputer 3.

(2) Variation caused by the fact that the battery monitoring IC 21 does not communicate with the low-voltage side battery monitoring IC.

(3) Variation of the consumption current caused by individual differences of the battery monitoring ICs 21 to 2n.

The resistance values of the pull-down resistors $R_1$ to $R_{n-1}$ are determined so as to equalize the consumption current of the battery monitoring ICs 21 to 2n in view of these causes. To be concrete, since the consumption current of the battery monitoring IC 21 is minimum as described above, the resistance value of the pull-down resistors $R_1$ provided at the battery monitoring IC 21 is set in a manner that the current flowing through this resistor is larger than the current flowing through the other pull-down resistors $R_2$ to $R_{n-1}$.

Figure 3:
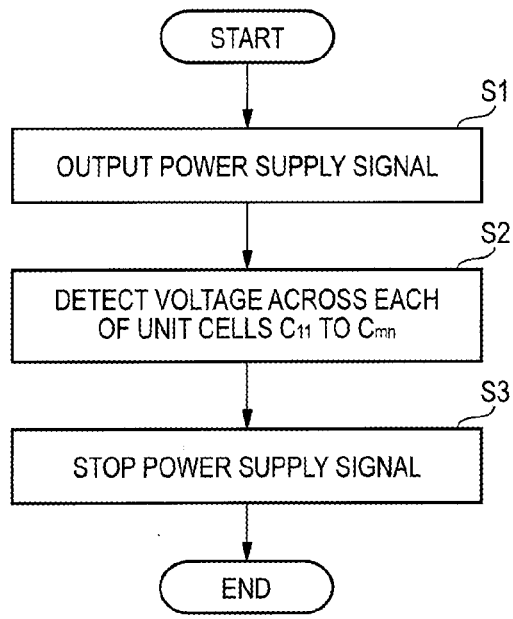
FIG. 3 A flowchart showing the processing procedure of a main microcomputer shown in FIG. 1.
Figure 4:
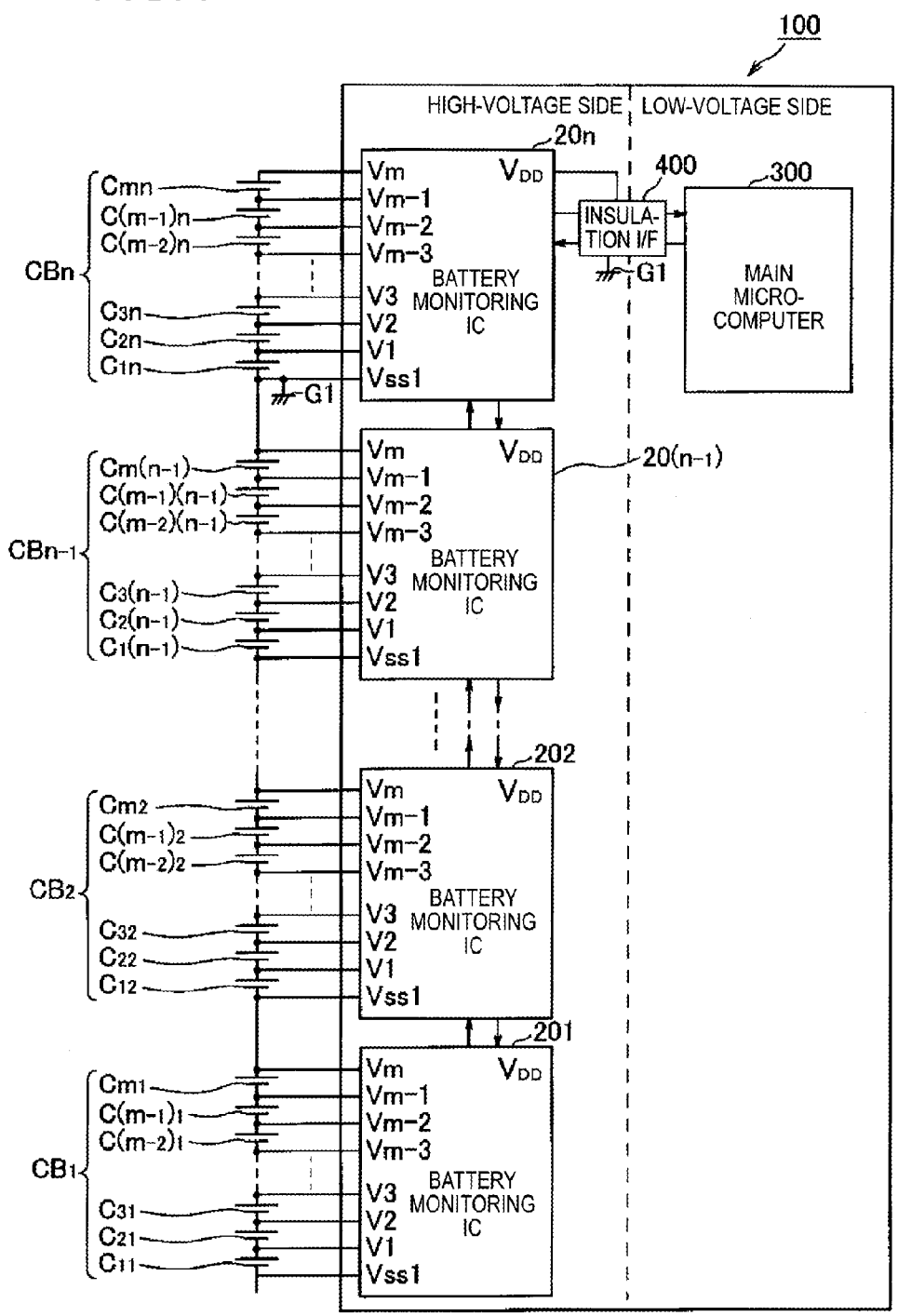
FIG. 4 A block diagram showing an example of a voltage detection device of related art.

Next, the operation of the voltage detection device 1 thus configured will be explained with reference to FIG. 3. The main microcomputer 3 starts a voltage detection processing in response to a trigger such as the turning on/off of an ignition switch. First, the main microcomputer 3 transmits the power supply signal to the power supply line 12 (step S1). Each of the interruption switches S of the battery monitoring ICs 21 to 2n is turned on in response to the transmission of this power supply signal. Thus, since the power supply voltage is supplied from the power supply circuit 11 to the respective parts of corresponding one of the battery monitoring ICs 21 to 2n, each of the battery monitoring ICs 21 to 2n starts the operation. Since the power supply voltage is also outputted from the power supply terminal $V_{DD}$ in response to the turning-on of the interruption switch S, the current begins to flow through corresponding one of the pull-down resistors $R_1$ to $R_{n-1}$.

Thereafter, the main microcomputer 3 sequentially outputs the voltage detection instructions to the battery monitoring ICs 21 to 2n, whereby each of the battery monitoring ICs 21 to 2n detects the anode side voltage of each of corresponding ones of the unit cells $C_{11}$ to $C_{mn}$ (step S2). When the control part 10 of each of the battery monitoring ICs 21 to 2n receives the voltage detection instructions, this control unit determines whether or not the instructions is destined thereto. When the control unit receives the voltage detection instructions not destined thereto, the control unit transfers this voltage detection instructions to the adjacent one or ones of the battery monitoring ICs 21 to 2(n−1) on the low-voltage side. In contrast, when the control unit receives the voltage detection instructions destined thereto, the control unit controls the control logic circuit 9 to thereby sequentially connect the terminals $V_1$ to $V_m$ to the input of the A/D converter 8 via the change-over switch 7. Thus, the A/D converter 8 sequentially subjects the voltage inputted into the terminals $V_1$ to $V_m$ to an A/D conversion, and then the control part 10 sequentially transmits the voltage thus converted toward the main microcomputer 3 as the detection voltage. The detection voltage transmitted from the battery monitoring IC 2n is directly transmitted to the main microcomputer 3. The detection voltage transmitted from each of the battery monitoring ICs 21 to 2(n−1) is transmitted to the main microcomputer 3 via the corresponding one or ones of the battery monitoring ICs 22 to 2n on the higher voltage side than the each battery monitoring IC. In this manner, the anode side voltage of the unit cells $C_{11}$ to $C_{mn}$ is sequentially transmitted to the main microcomputer 3.

When the detection of the voltage across each of the unit cells $C_{11}$ to $C_{mn}$ is completed, the main microcomputer 3 stops the transmission of the power supply signal (step S3). Consequently, the interruption switch S of each of the battery monitoring ICs 21 to 2n is turned off. Thus, since the supply of the power supply voltage from the power supply circuit 11 is interrupted, the operation of each of the battery monitoring ICs 21 to 2n stops. Further, since the output of the power supply voltage from each of the power supply terminals $V_{DD}$ is interrupted in response to the turning-off of each of the interruption switches S, the current flowing through each of the pull-down resistors $R_1$ to $R_{n-1}$ is also interrupted.

According to the aforesaid embodiment, since the consumption current of the battery monitoring ICs 21 to 2n is equalized by providing the pull-down resistors $R_1$ to $R_{n-1}$, the variation of the unit cells $C_{11}$ to $C_{mn}$ can be prevented. As a result, the variation of the consumption current, due to the increased amount of the consumption current required for feeding to the insulation I/F 4 so as to communicate with the main microcomputer 3, can be eliminated. Further, in the multi-stage connection configuration employed in order to realize the communication according to the daisy chain schema of the voltage detection device 1, the variation of the consumption current of the battery monitoring ICs 21 to 2n caused by the presence/non-presence of the communication connection on the low-voltage side can be eliminated. That is, the variation of the consumption current due to not communicating with the low-voltage side IC in the battery monitoring IC 21 can be eliminated. Further, the variation of the consumption current due to the individual differences of the battery monitoring ICs 21 to 2n can be eliminated. As a result, the variation of the voltage across each block among the respective blocks $CB_1$ to $CB_n$ can be prevented. Thus, since the usable range of the battery capacity used for the usual charging and discharging is not narrowed, the battery capacity can be used effectively without any waste, which results in the improvement of fuel cost of a vehicle. Further, since the equalizing discharge for adjusting the variation of the unit cells $C_{11}$ to $C_{mn}$ is not required at all or is required only with low frequency, the battery capacity is not consumed wastefully in the case of resistor consumption type discharge.

Further, according to the aforesaid embodiment, among the battery monitoring ICs 21 to 2n connected in cascade, the battery monitoring IC 2n on the one end side is connected to the main microcomputer 3 via the insulation I/F 4 so as to be capable of communication therebetween. Thus, the configuration of all the battery monitoring ICs 21 to 2n can be made same. Consequently, the common IC can be used as each of the battery monitoring ICs 21 to 2n. On the other hand, in a case of employing the configuration of connecting the battery monitoring IC 22 to the main microcomputer 3 in place of the configuration of connecting the battery monitoring IC 2n to the main microcomputer 3, it is necessary to provide terminals for connecting to the main microcomputer 3 in addition to the terminals for connecting to the battery monitoring ICs 23 and 21. Thus, only for the battery monitoring IC 22, it is required to use a battery monitoring IC having a larger number of the terminals than the other battery monitoring ICs.

Furthermore, according to the aforesaid embodiment, among the battery monitoring ICs 21 to 2n connected in cascade, the pull-down resistors $R_1$ provided at the battery monitoring IC 21 on the other end side is configured to flow a larger current than the other pull-down resistors $R_2$ to $R_{n-1}$. Thus, the consumption current of the battery monitoring ICs 21 to 2n can be equalized more surely.

In the aforesaid embodiment, although the battery monitoring IC 2n on the highest voltage side is connected to the main microcomputer 3 via the insulation I/F 4, the invention is not limited thereto. That is, in the invention, it is sufficient that arbitrary one of the battery monitoring ICs 21 to 2n is connected to the main microcomputer 3 so as to be capable of communication therewith. For example, the battery monitoring IC 21 on the lowest voltage side may be connected to the main microcomputer 3 via the insulation I/F 4.

Further, in the aforesaid embodiment, although the number of the unit cells constituting each of the blocks $CB_1$ to $CB_n$ is a common value m, the number of the unit cells may differ for each of the blocks $CB_1$ to $CB_n$.

Furthermore, in the aforesaid embodiment, the pull-down resistors $R_1$ to $R_{n-1}$ are provided in order to equalize the current consumed in the battery monitoring ICs 21 to 2n. However, in place of these resistors, elements such as electric circuits or electrical elements may be employed so long as they can perform the function of equalizing the consumption current.

The aforesaid embodiment merely shows the representative mode of the invention and the invention is not limited to this embodiment. That is, the invention can be implemented in various modified manners within a range not departing from the gist of the invention.

The feature of the embodiment of the voltage detection device according to the invention will be briefly summarized below as listed in [1] to [3].

[1] A voltage detection device which includes:
a plurality of voltage detection units (battery monitoring ICs 21 to 2n) that are respectively provided in correspondence to a plurality of blocks ($CB_1$ to $CB_n$) which are obtained by dividing a plurality of unit cells ($C_{11}$ to $C_{mn}$) connected in series, each of the plurality of voltage detection units being fed from corresponding one of the plurality of blocks and operated to detect a voltage across each of the unit cells constituting the corresponding one of the plurality of blocks;
a control unit (main microcomputer 3) that receives detection results from the plurality of voltage detection units;
an insulation interface (4) that connects between one of the plurality of voltage detection units and the control unit so as to be capable of communication therebetween;
current consumption elements (pull-down resistors $R_1$ to $R_{n-1}$) that are respectively connected in parallel to the plurality of blocks ($CB_1$ to $CB_{n-1}$) except for the block ($CB_n$) which corresponds to the voltage detection unit (battery monitoring IC 2n) connected to the control unit via the insulation interface so as to be capable of communication, thereby equalizing current consumed in the plurality of voltage detection units,
wherein the plurality of voltage detection units (1) are connected in cascade so as to be capable of communication mutually.

[2] The voltage detection device described in [1], wherein one (battery monitoring IC 2n) of the plurality of voltage detection units located on one end side of the plurality of voltage detection units connected in cascade is connected to the control unit via the insulation interface so as to be capable of communication.

[3] The voltage detection device described in [2], wherein one (pull-down resistors $R_1$) of the current consumption elements, connected in parallel to the block ($CB_1$) which corresponds to one (battery monitoring IC 21) of the plurality of voltage detection units located on the other end side of the plurality of voltage detection units connected in cascade, flows current larger than current flowing through the others (pull-down resistors $R_2$ to $R_{n-1}$) of the current consumption elements.

Although the invention is explained in detail and with reference to the particular embodiment, it will be obvious for those skilled in the art that various changes and modifications may be made without departing from the spirit and range of the invention.

The present application is based on Japanese Patent Application filed on Oct. 18, 2012 (Japanese Patent Application No. 2012-230606), the contents of which are incorporated herein by reference.

INDUSTRIAL APPLICABILITY

According to the voltage detection device of the invention, since the consumption current of the respective voltage detection units is equalized by providing the current consumption elements, the variation of the unit cells can be prevented. The invention attaining such the effect is useful in the field of the voltage detection device which detects a voltage across each of the unit cells connected in series.

REFERENCE SIGNS LIST 1 voltage detection device
3 main microcomputer (control unit)
4 insulation I/F (insulation interface)
21-2n battery monitoring IC (voltage detection unit)
$C_{11}$ to $C_{mn}$ unit cell
$CB_1$ to $CB_n$ block
$R_1$ to $R_{n-1}$ pull-down resistor (current consumption element)

The invention claimed is:

1. A voltage detection device, comprising:
a plurality of voltage detection units that are respectively provided in correspondence to a plurality of blocks which are obtained by dividing a plurality of unit cells connected in series, each of the plurality of voltage detection units being fed from corresponding one of the plurality of blocks and operated to detect a voltage across each of the unit cells constituting the corresponding one of the plurality of blocks;
a control unit that receives detection results from the plurality of voltage detection units;
an insulation interface that connects between one of the plurality of voltage detection units and the control unit so as to be capable of communication therebetween;
current consumption elements that are respectively connected in parallel to the plurality of blocks except for the block which corresponds to the voltage detection unit connected to the control unit via the insulation interface so as to be capable of communication, thereby equalizing current consumed in the plurality of voltage detection units,
wherein the plurality of voltage detection units are connected in cascade so as to be capable of communication mutually.

2. The voltage detection device according to claim 1, wherein one of the plurality of voltage detection units located on one end side of the plurality of voltage detection units connected in cascade is connected to the control unit via the insulation interface so as to be capable of communication.

3. The voltage detection device according to claim 2, wherein one of the current consumption elements, connected in parallel to the block which corresponds to one of the plurality of voltage detection units located on the other end side of the plurality of voltage detection units connected in cascade, flows current larger than current flowing through the others of the current consumption elements.

* * * * *